United States Patent
Aizawa

(10) Patent No.: US 12,304,114 B2
(45) Date of Patent: May 20, 2025

(54) METHOD FOR MANUFACTURING IMPRINT MOLD, IMPRINT MOLD, MOLD BLANK, AND METHOD FOR MANUFACTURING OPTICAL ELEMENT

(71) Applicant: HOYA CORPORATION, Tokyo (JP)

(72) Inventor: Takeshi Aizawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 361 days.

(21) Appl. No.: 17/762,874

(22) PCT Filed: Sep. 9, 2020

(86) PCT No.: PCT/JP2020/034121
§ 371 (c)(1),
(2) Date: Mar. 23, 2022

(87) PCT Pub. No.: WO2021/059979
PCT Pub. Date: Apr. 1, 2021

(65) Prior Publication Data
US 2022/0339826 A1   Oct. 27, 2022

(30) Foreign Application Priority Data
Sep. 27, 2019 (JP) .................................. 2019-177252

(51) Int. Cl.
*B29C 33/42* (2006.01)
*B29C 33/38* (2006.01)
(Continued)

(52) U.S. Cl.
CPC ........ *B29C 33/424* (2013.01); *B29C 33/3842* (2013.01); *B29C 59/002* (2013.01); *B29C 59/02* (2013.01)

(58) Field of Classification Search
CPC . B29C 33/424; B29C 33/3842; B29C 59/002; B29C 33/42; G03F 7/0002; H01L 21/027
See application file for complete search history.

(56) References Cited

U.S. PATENT DOCUMENTS

2003/0044728 A1    3/2003  Terada et al.
2018/0267401 A1*   9/2018  Kanamitsu ............ B29C 33/424

FOREIGN PATENT DOCUMENTS

CN    109937127 A       6/2019
CN    110244393 A  *    9/2019   ......... G02B 27/0172
(Continued)

OTHER PUBLICATIONS

English translation of JP-06258511-A by EPO. (Year: 1994).*
(Continued)

*Primary Examiner* — John J DeRusso
*Assistant Examiner* — Inja Song
(74) *Attorney, Agent, or Firm* — Sughrue Mion, PLLC

(57) ABSTRACT

Provided are an imprint mold having a plurality of recesses constituting a predetermined mold pattern, in which the imprint mold comprises a stack, comprising a plurality of mold base material layers and an etching stopper layer interposed between the mold base material layers, on a substrate, the stack has the plurality of recesses having different depths, the mold base material layer and the etching stopper layer are made of materials having etching selectivity for each other, and each of the plurality of recesses has a bottom surface on which the etching stopper layer is exposed, and technology related thereto.

8 Claims, 4 Drawing Sheets

(51) Int. Cl.
    *B29C 59/00*        (2006.01)
    *B29C 59/02*        (2006.01)

(56) References Cited

FOREIGN PATENT DOCUMENTS

| | | | | |
|---|---|---|---|---|
| JP | 06258511 A | * | 9/1994 | |
| JP | H06258510 A | | 9/1994 | |
| JP | H06258511 A | | 9/1994 | |
| JP | 2000303193 A | * | 10/2000 | ........... G02B 5/1857 |
| JP | 2004247430 A | | 9/2004 | |
| JP | 2018157093 A | | 10/2018 | |
| WO | 2018075174 A1 | | 4/2018 | |

OTHER PUBLICATIONS

English translation of JP-2000303193-A by EPO. (Year: 2000).*
English translation of CN-110244393-A by EPO. (Year: 2019).*
PCT/JP2020/034121, "English Translation of International Search Report", Nov. 2, 2020, 2 pages.
PCT/JP2020/034121, "International Preliminary Report on Patentability", Apr. 7, 2022, 5 pages.

* cited by examiner

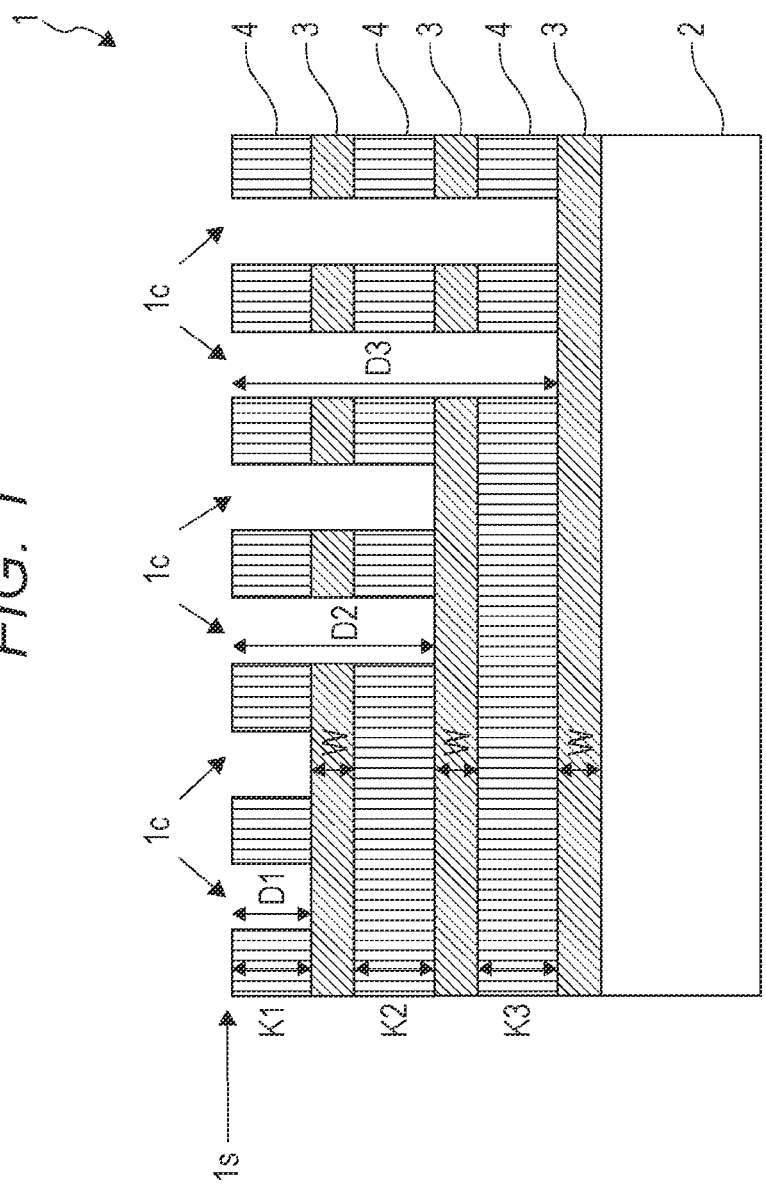

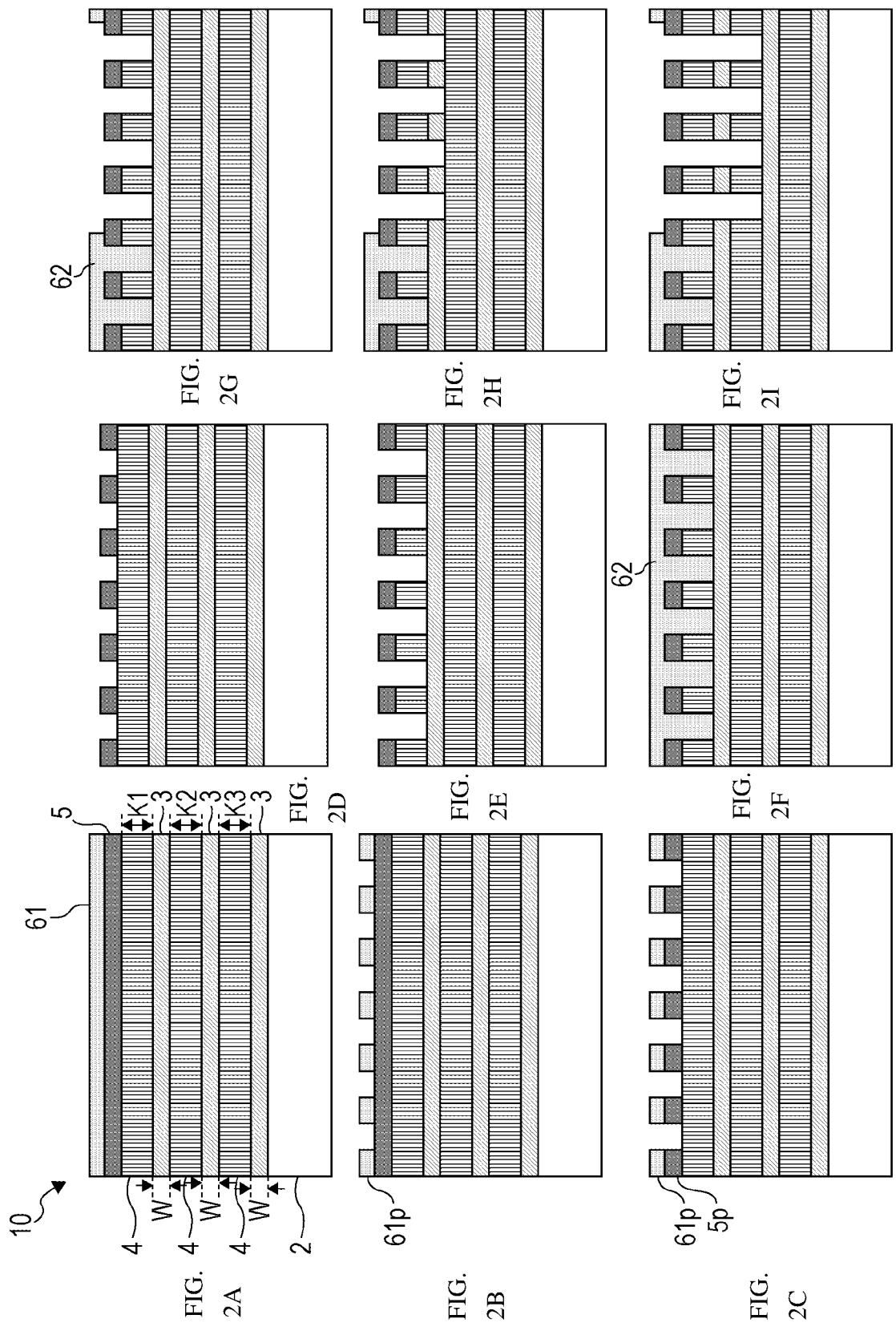

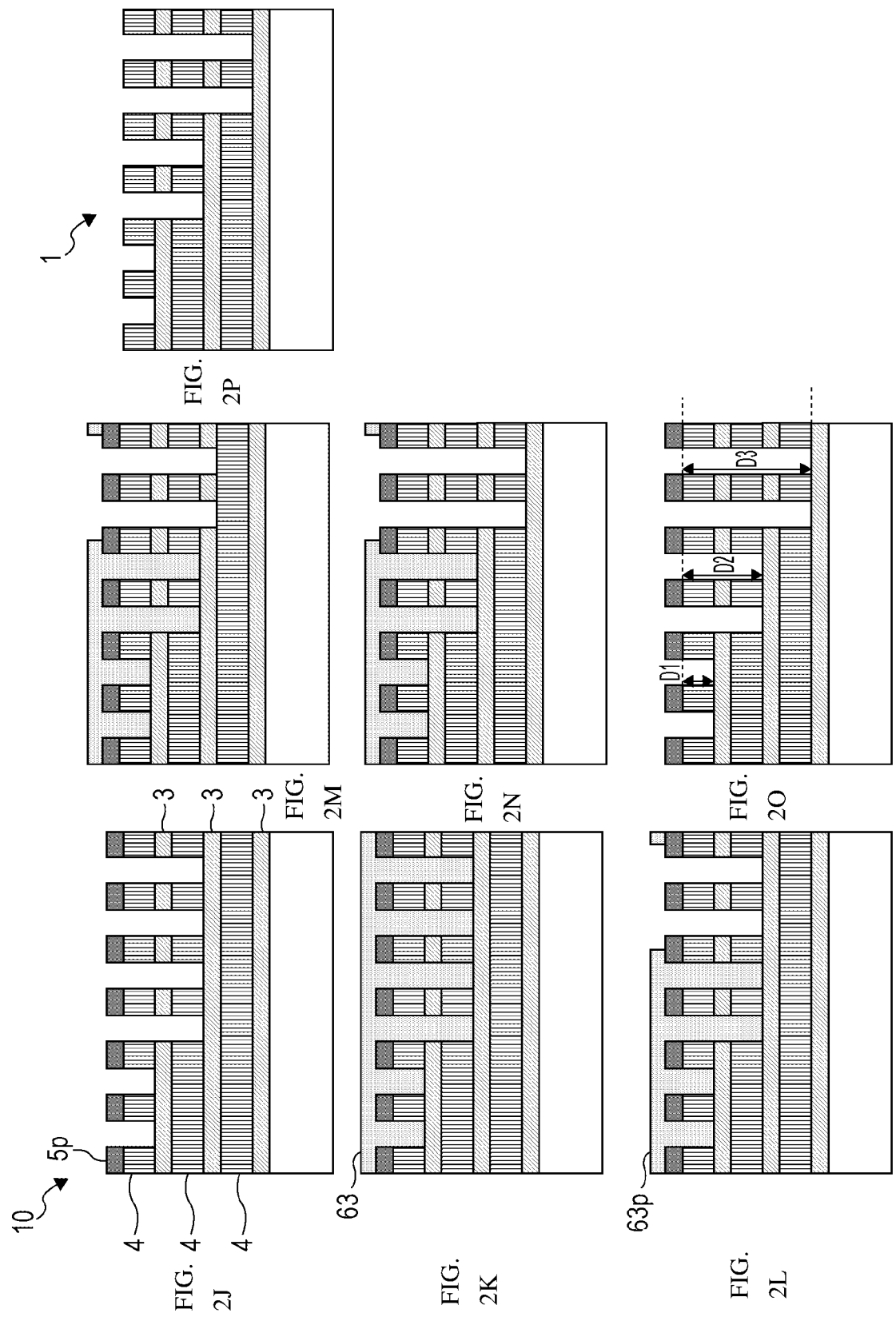

METHOD FOR MANUFACTURING IMPRINT MOLD, IMPRINT MOLD, MOLD BLANK, AND METHOD FOR MANUFACTURING OPTICAL ELEMENT

CROSS-REFERENCE TO RELATED APPLICATIONS

This application is the National Stage of International Application No. PCT/JP2020/034121, filed Sep. 9, 2020, which claims priority to Japanese Patent Application No. 2019-177252, filed on Sep. 27, 2019, and the contents of which is incorporated by reference.

TECHNICAL FIELD

The present disclosure relates to an imprint mold for forming a fine pattern of an optical element or the like by imprint, and particularly relates to an imprint mold preferable for transferring a fine three-dimensional transfer pattern to a material such as resin by optical imprint, a method for manufacturing the imprint mold, and a mold blank.

BACKGROUND ART

Imprint technology is a promising method in various fields such as a semiconductor, biotechnology, and a medical as ultrafine processing technology.

Patent Document 1 describes a molding die for manufacturing a blazed diffraction grating, the molding die including a substrate and a plurality of two-layered films layered on a surface of the substrate, in which each of the two-layered films consist of a first thin film having a high reactivity to one etching gas out of two etching gases and having a low reactivity to the other etching gas, and a second thin film having a low reactivity to the one etching gas and having a high reactivity to the other etching gas.

PRIOR ART DOCUMENT

Patent Document

Patent Document 1: JP H06-258510 A

SUMMARY OF DISCLOSURE

Technical Problem

For example, a structure having a desired three-dimensional pattern on a surface of a substrate such as glass, metal, or Si is used as an optical element such as a diffraction grating. When a fine pattern is formed on these products, an imprint mold method using a mold having the above pattern (also referred to as a template, a stamper, a die, a casting mold, or an original plate) may be applied. Hereinafter, the imprint mold method is also simply referred to as an imprint method or imprint.

In the imprint method, for example, in a state where a three-dimensional pattern of a mold is pressed against a layer made of a photocurable or thermosetting resin applied onto a substrate, the resin is irradiated with light (optical imprint) or heated (thermal imprint) to cure the resin. As a result, the shape of the mold is transferred to the resin layer to form a pattern.

As described above, the imprint method is a method for directly pressing a mold against resin or the like applied onto a substrate or the like to transfer a pattern. Therefore, the dimensions of the pattern of the mold and the depth thereof directly affect the shape of a fine pattern to be produced.

With an increasing demand for an optical element with higher accuracy, an imprint mold with higher accuracy is desired. In particular, a mold pattern (hereinafter, also referred to as a transfer pattern) of an imprint mold is transferred at the same magnification unlike a semiconductor photomask to which reduced exposure is applied. Therefore, pattern accuracy required for the imprint mold is directly reflected in accuracy required for a pattern of an optical element as a final product. Therefore, the fine transfer pattern of the imprint mold is desirably formed with extremely high accuracy. However, it is not easy to precisely form a three-dimensional shape of a transfer pattern having a width or a depth of less than 1 µm.

As mentioned above, Patent Document 1 describes the molding die for manufacturing a diffraction grating for inexpensively manufacturing a blazed diffraction grating by a replica method. Since this molding die has a stepped mold shape consisting of a bottom surface and two steps, it is considered that this stepped shape forms a portion corresponding to an inclined surface of the blazed diffraction grating in a replica to be obtained. In addition, Patent Document 1 describes that depth accuracy of a recess bottom surface and a step of the molding die for transferring to a diffraction grating and uniformity thereof can be improved.

On the other hand, in a mold having a transfer pattern having a plurality of recesses (dug portions), it is required to maintain not only depth accuracy thereof but also position accuracy of each recess at a high level. That is, the present inventor has focused on the fact that it is important to improve accuracy of a three-dimensional shape of a mold in order to improve performance of a final product.

An aspect of the present disclosure is to provide an imprint mold and a method for manufacturing the imprint mold, having high formation accuracy of a three-dimensional shape transfer pattern having a plurality of recesses (dug portions).

Solution to Problem

A first aspect of the present disclosure is
a method for manufacturing an imprint mold having a plurality of recesses constituting a predetermined mold pattern, the method comprising:
preparing a mold blank in which a stack is formed on a substrate, the stack comprising a plurality of mold base material layers and an etching stopper layer interposed between the mold base material layers, and a hard mask layer is formed on the stack;
etching the hard mask layer based on a design of the mold pattern to form a hard mask pattern;
forming the plurality of recesses having different depths by performing mold digging etching that etches the mold base material layer or the etching stopper layer and the mold base material layer using a predetermined resist pattern and the hard mask pattern as a mask N times (N is an integer of 2 or more), the predetermined resist pattern formed on the stack on which the hard mask pattern is formed; and
removing the hard mask pattern, in which
the mold base material layer and the etching stopper layer are made of materials having etching selectivity for each other, and
each of the plurality of formed recesses has a bottom surface on which the etching stopper layer is exposed.

A second aspect of the present disclosure is the method for manufacturing an imprint mold according to the first aspect, in which the number of times N of the mold digging etching satisfies 2≤N≤5.

A third aspect of the present disclosure is the method for manufacturing an imprint mold according to the first or second aspect, in which the stack comprises the plurality of mold base material layers having different thicknesses.

A fourth aspect of the present disclosure is the method for manufacturing an imprint mold according to any one of the first to third aspects, in which each of the plurality of recesses having respectively different depths is formed by vertically digging a mold surface individually and independently.

A fifth aspect of the present disclosure is the method for manufacturing an imprint mold according to any one of the first to fourth aspects, in which the etching stopper layer is disposed between the mold base material layer closest to the substrate and the substrate.

A sixth aspect of the present disclosure is an imprint mold having a plurality of recesses constituting a predetermined mold pattern, in which the imprint mold comprises a stack, comprising a plurality of mold base material layers and an etching stopper layer interposed between the mold base material layers, on a substrate, the stack has the plurality of recesses having different depths, the mold base material layer and the etching stopper layer are made of materials having etching selectivity for each other, and each of the plurality of recesses has a bottom surface on which the etching stopper layer is exposed.

A seventh aspect of the present disclosure is the imprint mold according to the sixth aspect, in which each of the plurality of recesses having respectively different depths is formed by vertically digging a mold surface individually and independently.

An eighth aspect of the present disclosure is the imprint mold according to the sixth or seventh aspect, in which the stack comprises the plurality of mold base material layers having different thicknesses.

A ninth aspect of the present disclosure is the imprint mold according to any one of the sixth to eighth aspects, in which ultraviolet ray transmittances of the mold base material layer and the etching stopper layer are 1:0.8 to 1:0.95 when the mold base material layer and the etching stopper layer have the same thickness.

A tenth aspect of the present disclosure is the imprint mold according to any one of the sixth to ninth aspects, in which the thickness of the mold base material layer is 3 times or more and 25 times or less the thickness of the etching stopper layer.

An eleventh aspect of the present disclosure is the imprint mold according to any one of the sixth to tenth aspects, in which the plurality of recesses is formed by etching and removing different numbers of the mold base material layers, the numbers being two or more and five or less.

A twelfth aspect of the present disclosure is the imprint mold according to any one of the sixth to eleventh aspects, in which the etching stopper layer is disposed between the mold base material layer closest to the substrate and the substrate.

A thirteenth aspect of the present disclosure is the imprint mold according to any one of the sixth to twelfth aspects, which is to be applied to optical imprint using an ultraviolet ray.

A fourteenth aspect of the present disclosure is a mold blank for manufacturing an imprint mold having a mold pattern having a plurality of recesses having different depths, the mold blank for obtaining the imprint mold having recesses having depths D1 and D2 (D1≠D2) from a mold surface, in which a plurality of mold base material layers is layered on a surface of a substrate, and a hard mask layer is further formed on a surface side of the mold base material layers, an etching stopper layer having a thickness W and made of a material having etching selectivity for the mold base material layer is interposed between each of the mold base material layers, and the thickness of each of the plurality of mold base material layers is set so as to satisfy $K1=D1$ and $K2=D2-(D1+W)$, in which K1 represents the thickness of the mold base material layer farthest from the substrate, and K2 represents the thickness of the second highest mold base material layer in the stack.

A fifteenth aspect of the present disclosure is a mold blank for obtaining an imprint mold having recesses having depths D1, D2, ... Dn (n is an integer of 3 or more, and D1, D2 ... Dn are different from each other) from a mold surface, in which a plurality of mold base material layers is layered on a surface of a substrate, and a hard mask layer is further formed on a surface side of the mold base material layers, an etching stopper layer having a thickness W and made of a material having etching selectivity for the mold base material layer is interposed between each of the mold base material layers, and the thickness of each of the plurality of mold base material layers is set so as to satisfy $K1=D1$ and $K2=D2-(D1+W)$ $Kn=Dn-(D1+D2+ \ldots (n-1)W)$, in which K1 represents the thickness of the mold base material layer farthest from the substrate, K2 represents the thickness of the second highest mold base material layer, and Kn represents the thickness of the n-th highest mold base material layer in the stack.

A sixteenth aspect of the present disclosure is the mold blank according to the fourteenth or fifteenth aspect, in which the mold base material layer comprises silicon and oxygen, and the etching stopper layer comprises silicon, aluminum, and oxygen.

A seventeenth aspect of the present disclosure is the mold blank according to any one of the fourteenth to sixteenth aspects, in which the etching stopper layer has a refractive index n of 2.2 or less with respect to light having a wavelength of 365 nm.

An eighteenth aspect of the present disclosure is the mold blank according to any one of the fourteenth to seventeenth aspects, in which the etching stopper layer has an extinction coefficient k of 0.01 or less with respect to light having a wavelength of 365 nm.

A nineteenth aspect of the present disclosure is a method for manufacturing an optical element, the method comprising:

preparing the imprint mold according to any one of the sixth to thirteenth aspects; and directly or indirectly pressing a mold surface of the imprint mold against an object comprising a resin material, and transferring the mold pattern to the object.

Advantageous Effects of Disclosure

The present disclosure can provide an imprint mold and a method for manufacturing the imprint mold, having high formation accuracy of a three-dimensional shape transfer pattern having a plurality of recesses.

BRIEF DESCRIPTION OF DRAWINGS

FIG. 1 is a schematic cross-sectional view illustrating an example of a structure of an imprint mold according to a present embodiment.

FIGS. 2A-2I are schematic cross-sectional views (No. 1) illustrating an example of a method for manufacturing the imprint mold according to the present embodiment.

FIGS. 2J-2P are schematic cross-sectional views (No. 2) illustrating an example of the method for manufacturing the imprint mold according to the present embodiment.

DESCRIPTION OF EMBODIMENTS

Figure 3C:
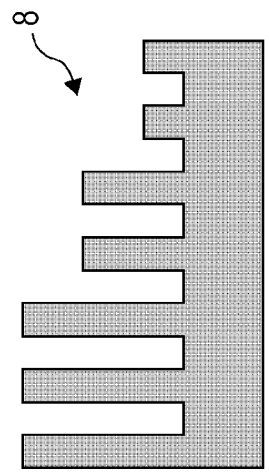
FIGS. 3A-3C are schematic cross-sectional views illustrating an outline of pattern transfer by optical imprint using the imprint mold of the present embodiment.

An embodiment according to the present disclosure will be described with reference to the drawings. The drawings are illustrated for explanation, and the present disclosure is not limited thereto. In addition, the drawings are schematic, and a dimensional ratio between parts, the order of disposing the parts, and the number of the parts do not necessarily coincide with the actual ones.

<Imprint Mold 1>

An imprint mold 1 according to the present embodiment can be preferably used as a mold used in an imprint method. Hereinafter, the imprint mold 1 is also simply referred to as a mold 1. Specifically, a mold pattern of the mold 1 according to the present embodiment is transferred to an object such as resin, and an obtained formed product such as an optical element (or a formed product obtained by further transferring a replica of the obtained formed product to a separately prepared material) can be used for various applications.

For example, the mold 1 according to the present embodiment can be advantageously used for a semiconductor, a MEMS member, a bio-related member, a medical-related member, and an optical element (diffraction grating or the like). For the optical element, the mold 1 according to the present embodiment can be used for a display device or the like.

FIG. 1 is a schematic cross-sectional view illustrating an example of a structure of the mold 1 according to the present embodiment.

As illustrated in FIG. 1, the mold 1 of the present embodiment has a stack having a plurality of mold base material layers 4 on a substrate 2 and an etching stopper layer 3 interposed between each mold base material layers 4. In addition, in the present embodiment, the etching stopper layer 3 is also disposed between the mold base material layer 4 located at the lowest position (located closest to the substrate 2) and the substrate 2.

Note that in the present specification, a surface of the substrate 2 on a side where a mold pattern is formed in the imprint mold 1 including the substrate 2 is referred to as a substrate main surface (or simply referred to as a substrate surface), the main surface side is referred to as an upper side, and a back surface side of the main surface is referred to as a lower side.

The mold 1 has a plurality of recesses 1c for constituting a predetermined mold pattern.

The mold 1 of the present embodiment has a mold pattern having recesses 1c (dug portions) having N different depths (here, three different depths) and formed by vertically digging a mold surface 1s individually and independently. The depths from the mold surface 1s are D1, D2, and D3, respectively, and FIG. 1 illustrates a case where D1<D2<D3 is satisfied. As described above, the mold 1 of the present embodiment has the plurality of recesses 1c having different depths. Of course, the plurality of recesses 1c having the same depth, which may be any depth, may be included (in FIG. 1, two recesses 1c have the same depth, and six recesses 1c in total are included). The three-dimensional shape of such a mold pattern is transferred to an object made of a resin material or the like, and an inverted pattern is formed on the object. That is, the mold pattern of the mold 1 of the present embodiment is obtained by inverting a three-dimensional shape to be formed on an object to which transferring is applied.

The depth of the recess 1c (dug portion) is determined according to an application. For example, in a case of an optical element, the depth can be 10 to 500 nm depending on light to be applied, and more specifically, may be about 10 to 300 nm, for example. In addition, when the depth of the recess 1c is in such a range, the effect of the disclosure is remarkable. This is because the fine depth of the recess 1c in the fine pattern can be precisely controlled by a manufacturing method described later.

The mold pattern of the mold 1 of the present embodiment is designed according to an application. For example, according to the present disclosure, there can be the recesses 1c having N depths (for example, 2≤N≤5).

The depth of the recess 1c can be accurately controlled by designing the mold blank 10 to be prepared for obtaining the mold 1 of the present embodiment. This point will be further described later.

The mold surface 1s is the uppermost plane surface of the mold 1 (a plane surface located at the farthest position from the substrate 2). When a mold pattern is transferred to an object made of resin or the like using the mold 1 of the present embodiment, the mold surface 1s is directly or indirectly brought into contact with a pattern forming surface of the object, and pressed against the pattern forming surface. Examples of the case where the mold surface 1s is indirectly pressed include a case where a functional layer such as a mold release agent or an additional layer is formed on a surface of the mold surface 1s or interposed between the mold surface 1s and the pattern forming surface.

In the present embodiment, each of the recesses 1c is formed by independently digging the mold surface 1s. Therefore, in the shape of the mold pattern (plan view of the mold pattern) viewed from the mold surface 1s side, each recess 1c is sandwiched or surrounded by the mold surface 1s. This is advantageous in accurately adjusting an angle and positioning when the mold pattern is transferred to the object.

In addition, in the mold pattern of such a design, the effect of the present disclosure that makes it possible to precisely control the width, position, and depth of the recess 1c is remarkably exhibited, and by applying this, a wide range of application to a product such as optical element can be performed.

For example, the mold pattern (plan view) may be a line-shaped pattern in which portions of the mold surface 1s remaining in a line shape are regularly arranged via the line-shaped recesses 1c, a hole arrangement pattern in which the plurality of recesses 1c having predetermined diameters is formed on the mold surface 1s, or another design.

In a case where the mold pattern is the above-described line-shaped arrangement pattern, a pitch (period) thereof can be in a range of 50 to 1000 nm, or more specifically, 70 to 500 nm. Of course, the mold pattern may be a pattern in which the recesses 1c (dug portions) having the same pattern width (also referred to as CD) and the same pattern pitch are repeatedly arranged or a pattern whose dimensions change depending on a position.

Even in a case where the mold pattern is the hole pattern, the shape of each hole is not particularly limited, and a design such as a square, a rectangle, or a circle is possible. The diameter of an inscribed circle of the hole shape) of each hole can be 50 to 1000 nm, and furthermore may be in a range of 70 to 500 nm.

In addition, a pattern aspect ratio of the recess 1c (that is, (depth of the recess 1c)/(bottom width of the recess 1c)) can be, for example, 0.1 to 5.

The mold 1 of the present embodiment does not have a stepped step in each recess 1c. That is, each recess 1c has a single depth. As illustrated in FIG. 1, a side wall of each recess 1c has an exposed structure in which the mold base material layer 4 and the etching stopper layer 3 are alternately layered. As described later, each recess 1c is formed by patterning the mold base material layer 4 and the etching stopper layer 3 with different etchants. Therefore, it is difficult to avoid generation of a slight step between the mold base material layer 4 and the etching stopper layer 3 on the side wall. However, such a step is a slight protrusion of the etching stopper layer 3 on the side wall with respect to the mold base material layer 4 on the side wall, or a slight recess of the etching stopper layer 3 on the side wall with respect to the mold base material layer 4 on the side wall. Each of these steps on the side wall has a size of about several nm. In general, this is not called a stepped step.

The etching stopper layer 3 is exposed on a bottom surface of each recess 1c as described later. That is, each recess 1c is formed by digging the mold surface 1s so as to have a depth to the position of a surface of any one of the plurality of etching stopper layers 3. The etching stopper layer 3 is left without being removed. Each recess 1c is constituted by a side wall formed by the mold base material layer 4 and the etching stopper layer 3, and a bottom surface formed by the etching stopper layer 3.

The "plurality of recesses 1c constituting the mold pattern" means that a plurality of portions recessed from the mold surface 1s is formed. The number of recesses 1c is not particularly limited, but may be 100 to 2000 in a rectangular area having a side of 100 mm, for example. As described above, the plurality of recesses 1c can have different depths, but some recesses 1c may have the same depth.

The CD of each recess 1c (dug portion) is also determined according to an application similarly. For example, a dug portion having a width of 50 to 1000 nm, preferably about 70 to 500 nm can be formed by digging a surface vertically. The shape of the side wall of each recess 1c is preferably vertical. Specifically, the side wall of the recess 1c is preferably within a range of ±10 degrees with respect to a virtual surface perpendicular to a bottom surface of the recess 1c (within a range of 80 degrees or more and 100 degrees or less with respect to the bottom surface), and more preferably within a range of ±5 degrees (within a range of 85 degrees or more and 95 degrees or less with respect to the bottom surface).

In other words, such a mold in which the fine depth/CD is precisely controlled can be provided as the mold 1 of the present embodiment.

(Substrate 2)

The substrate 2 supports the stack in which a digging pattern is formed.

A material of the substrate 2 is not particularly limited. However, a material having light transmission is preferable. In this case, the substrate 2 is advantageous when being applied to optical imprint. For example, in a state where the mold surface is of the mold 1 is pressed against an object having a photocurable resin layer formed on the substrate 2, when the resin is irradiated with light, the light can be emitted from a back surface side of the substrate 2. That is, the above-described "light transmission" means that light is transmitted to such an extent that the photocurable resin can be cured by light emitted via the substrate 2. Having light transmission is also referred to as "transparent".

Note that in optical imprint, resin curing by an ultraviolet ray is preferably adopted. For example, the ultraviolet ray transmittance in a thickness direction of the substrate 2 is preferably 70% or more, and more preferably 90% or more. The ultraviolet ray here is light having a wavelength in a range of 10 to 400 nm, preferably 200 to 380 nm. For example, the above-described ultraviolet ray transmittance may be set with 365 nm as a reference wavelength. A similar setting will be adopted for an ultraviolet ray described below.

The shape of the substrate 2 is not particularly limited, and may be, for example, a disk shape or a rectangular flat plate shape. As for the size of the substrate 2, for example, in a case of the imprint mold 1 for an optical element, the length of one side can be 10 to 300 mm. The thickness of the substrate 2 is not particularly limited. However, considering the ultraviolet ray transmittance described above, for example, in the case of the imprint mold 1 for an optical element, the thickness of the substrate 2 may be about 5 to 15 mm.

Examples of a specific material constituting the substrate 2 include a material containing silicon and oxygen (quartz glass, aluminosilicate glass, soda-lime glass, and the like), a material containing silicon, oxygen, and titanium ($SiO_2$—$TiO_2$ low thermal expansion glass and the like), a material containing aluminum and oxygen (sapphire and the like), and the like. In the present embodiment, an example in which a quartz substrate is used as the substrate 2 will be described. The quartz substrate can be processed to be flat and smooth in addition to being transparent to irradiation light in optical imprint, and therefore, for example, can be used as an imprint mold to perform transfer with high accuracy.

(Stack)

As can be understood from FIG. 1, the mold 1 of the present embodiment has the plurality of mold base material layers 4 and the etching stopper layer 3 interposed between the mold base material layers 4. That is, the mold of the present embodiment has a stack including a plurality of mold layers having different thicknesses.

The mold base material layer 4 is a main base material constituting the mold 1. The mold base material layer 4 is preferably made of a material transparent to irradiation light of optical imprint. For the mold base material layer 4, a material containing silicon, such as silicon dioxide, for example, can be selected. In addition, for the mold base material layer 4, it is more preferable to use a material containing silicon and one or more elements selected from oxygen and nitrogen, and it is still more preferable to use a material containing silicon and oxygen. Specifically, in addition to silicon dioxide ($SiO_2$), $Si_3N_4$, SiON and the like can be contained. On the other hand, a material containing hafnium, such as hafnium oxide, may be selected.

The refractive index n of the etching stopper layer 3 with respect to an ultraviolet ray at a reference wavelength (wavelength 365 nm) is preferably 1.7 or less, more preferably 1.6 or less, and still more preferably 1.5 or less. The extinction coefficient k of the etching stopper layer 3 with respect to an ultraviolet ray at a reference wavelength (wavelength 365 nm) is preferably 0.003 or less, and more preferably 0.001 or less. Note that the materials of the plurality of mold base material layers 4 are not necessarily the same, and one or more of materials having characteristics described later may be used.

The material of each mold base material layer 4 is preferably transparent to light to be used (the above-described ultraviolet ray). For example, the ultraviolet ray transmittance of each mold base material layer 4 in a thickness direction is preferably 70% or more, and more preferably 90% or more.

The thickness (layer thickness) of each mold base material layer 4 can be determined based on the shape of a mold pattern to be obtained. That is, the thickness can be determined according to the set depth of each recess 1c (each dug portion) of the mold pattern. For example, the thickness of the mold base material layer 4 may be set in a range of 10 to 500 nm, or may be set in a range of 30 to 200 nm. Within this range, stable film formation conditions for obtaining a uniform film thickness can be selected.

Although the thicknesses of the mold base material layers 4 are illustrated to be substantially the same in FIGS. 1 to 3P, the mold 1 of the present disclosure is not limited thereto, and the mold base material layers 4 having different thicknesses may be included. When the mold pattern of the present embodiment is formed, by determining the depth of the mold base material layer 4 (or the etching stopper layer 3 and the mold base material layer 4) to be removed (dug) by etching, the recess 1c having a desired depth can be obtained. In other words, the thickness of each of the mold base material layers 4 and building-up order are determined in advance according to the type of depth of the recess 1c to be obtained. At this time, the thickness of the etching stopper layer 3 interposed between each mold base material layers 4 is considered. This point will be further described later.

In addition, as described in <Method for manufacturing imprint mold 1> later, the etching stopper layer 3 is interposed between each mold base material layers 4, and when the mold base material layers 4 are etched and removed, digging depths thereof are independently controlled for each of the mold base material layers 4, and the depth of the recess 1c as designed can be accurately obtained.

By disposing the etching stopper layer 3 as described above, the depth of the recess 1c (dug portion) can be easily set from the total layer thickness of the mold base material layer 4 having a predetermined thickness set in advance and the etching stopper layer 3 having a predetermined thickness set in advance in a portion to be dug from the mold surface 1s.

The etching stopper layer 3 has a function of accurately stopping etching when each digging is formed. Over-etching time can be set appropriately, and the shape of the bottom of the recess 1c can be formed as designed.

In the mold 1 according to the present embodiment, each of the plurality of recesses 1c has a bottom surface on which the etching stopper layer 3 is exposed.

In the present embodiment, since the etching stopper layer 3 is exposed on the bottom surface of any of the recesses 1c, it is considered that the bottom surface can be used for inspection of a mold product (optical inspection/guarantee of the depth of the recess 1c).

The number of the mold base material layers 4 to be built up in the stack can be determined according to an application of the mold 1, and is not particularly limited. For example, two to five layers can be built up depending on the depth type of the recess 1c to be formed, and three or four layers are more preferable. That is, at least one of the recesses 1c is preferably formed by etching and removing the N ($2 \leq N \leq 5$, preferably $3 \leq N \leq 4$) mold base material layers 4 (including the etching stopper layer 3 interposed between the mold base material layers 4 to be removed).

In this case, in a case where optical imprint is adopted, an object to which transferring is applied is uniformly cured regardless of an influence of light reflection or scattering at an interface between the mold base material layer 4 and the etching stopper layer 3.

The etching stopper layer 3 is made of a material having etching resistance to an etchant (for example, an etching gas) of the mold base material layer 4. In addition, the mold base material layer 4 has etching resistance to an etchant of the etching stopper layer 3. The mold base material layer 4 and the etching stopper layer 3 are made of materials having etching selectivity for each other.

Specific examples of the material of the etching stopper layer 3 include a material containing silicon dioxide ($SiO_2$) and aluminum (Al) (for example, aluminum oxide ($Al_2O_3$)), a material containing hafnium (Hf) (for example, hafnium oxide ($HfO_2$)), a material containing chromium (Cr) (for example, at least one of chromium oxide (CrO), chromium nitride (CrN), chromium oxynitride (CrON), and a material containing carbon in each of these compounds), and the like.

However, the material of the etching stopper layer 3 has etching selectivity for the material of the mold base material layer 4. Therefore, in a case where a Si-containing material such as $SiO_2$ is used for the mold base material layer 4, a material containing aluminum or chromium is preferably used for the etching stopper layer 3. The etching stopper layer 3 is more preferably made of a material containing silicon, aluminum, and oxygen. Such an etching stopper layer 3 has high etching selectivity for the mold base material layer 4, has high cleaning resistance, and has high light transmission to an ultraviolet ray used at the time of optical imprint. In a case where both the substrate 2 and the mold base material layer 4 are made of a material containing silicon, adhesion between the substrate 2 and the etching stopper layer 3 and adhesion between the mold base material layer 4 and the etching stopper layer 3 are both improved.

The refractive index n of the etching stopper layer 3 with respect to light (ultraviolet ray) at a reference wavelength (wavelength 365 nm) is preferably 2.2 or less, more preferably 1.9 or less, and still more preferably 1.6 or less. The extinction coefficient k of the etching stopper layer 3 with respect to light (ultraviolet ray) at a reference wavelength (wavelength 365 nm) is preferably 0.01 or less, and more preferably 0.005 or less.

In the present specification, the etching selectivity of the etching stopper layer 3 for the mold base material layer 4 is specified by a formula (etching speed of etching stopper layer 3)/(etching speed of mold base material layer 4) when the same etchant is used. The etching selectivity specified by this formula is also referred to as an etching selection ratio.

"High etching selectivity between the mold base material layer 4 and the etching stopper layer 3" means that a value of the above definition formula is significantly large or significantly close to zero when a predetermined etchant is used. For example, the etching selection ratio of the etching stopper layer 3 at the time of etching the mold base material layer 4, that is, (etching speed of etching stopper layer 3)/(etching speed of mold base material layer 4) is preferably ½ to ¹⁄₁₀₀₀.

For example, the mold base material layer 4 is made of $SiO_2$, carbon tetrafluoride ($CF_4$) is applied to an etchant of the mold base material layer 4, the etching stopper layer 3 is made of a material made of $Al_2O_3$ and $SiO_2$, and carbon tetrachloride ($CCl_4$) is applied to an etchant of the etching stopper layer 3.

In the above example, in a case where the etchant $CF_4$ is used, a value of (etching speed of etching stopper layer 3)/(etching speed of mold base material layer 4) approaches zero because the etching speed of the etching stopper layer 3 made of $Al_2O_3$ is extremely low. On the other hand, in a case where the etchant $CCl_4$ is used, a value of (etching speed of etching stopper layer 3)/(etching speed of mold base material layer 4) is 10 or more because the etching speed of the mold base material layer 4 made of $SiO_2$ is extremely low.

The plurality of etching stopper layers 3 may have the same thickness, or the etching stopper layers 3 having different thicknesses may be included.

Note that one type or a plurality of types of materials may be used for the etching stopper layers 3. Considering an ultraviolet ray transmittance described later and stability of etching conditions, all the etching stopper layers 3 are preferably made of the same material, and the thicknesses thereof are also preferably the same.

In order to apply the mold 1 according to the present embodiment to optical imprint, the material of each etching stopper layer 3 preferably has high transparency to light (particularly an ultraviolet ray) used for optical imprint. For example, the ultraviolet ray transmittance of each etching stopper layer 3 in a thickness direction is preferably 70% or more, and more preferably 90% or more.

In addition, the transmittance of the material used for each of the mold base material layer 4 and the etching stopper layer 3 preferably satisfies T1>T2 (T1: a sample of the material of the mold base material layer 4, T2: a sample of the material of the etching stopper layer 3) when both samples having the same thickness are compared with each other, and a relative ratio thereof can be T1:T2=1:0.8 to 1:0.95.

The thickness of the etching stopper layer 3 is preferably small as long as the etching stopper layer 3 can satisfactorily exhibit the function of stopping etching. If the thickness is too large, not only the etching time is increased, but also the light transmission of the mold 1 is lowered disadvantageously. The thickness of the etching stopper layer 3 can be, for example, 3 to 30 nm, preferably 5 to 20 nm, and more preferably 8 to 20 nm.

The thickness of the mold base material layer 4 is preferably 3 to 25 times, and more preferably 3 to 20 times the thickness of the etching stopper layer 3.

Note that the material of the mold base material layer 4 and the material of the etching stopper layer 3 are selected so as to have sufficient transparency to irradiation light used for optical imprint. Therefore, the materials listed above are preferably used. In particular, since the mold base material layer 4 is relatively thicker than the etching stopper layer 3, it is desired to adopt a material having higher transparency for the mold base material layer 4.

On the other hand, an etching rate Rs at which the etching stopper layer 3 is etched by an etchant of the mold base material layer 4 may be smaller than an etching rate Rb at which the mold base material layer 4 is etched by an etchant of the etching stopper layer 3, that is, Rb>Rs may be satisfied. That is, it has been clarified that a damage that the etching stopper layer 3 receives from the etchant of the mold base material layer 4 may be relatively lower than a damage that the mold base material layer 4 receives from the etchant of the etching stopper layer 3. Therefore, it has been revealed that it is advantageous to leave the etching stopper layer 3 on a bottom surface of the recess 1c in order to precisely control a digging amount of ±5 nm or ±2 nm with respect to a target value for control of the depth of the recess 1c in the mold pattern.

(Other Layers)

The mold 1 according to the present embodiment may include a primer layer for improving adhesiveness and impact resistance, a conductive layer which suppresses charge-up during electron beam drawing, and the like, if necessary. In a case where each mold base material layer 4, each etching stopper layer 3, and/or a hard mask layer 5 described later have conductivity, a charge-up suppressing effect may be obtained.

<Method for Manufacturing Imprint Mold 1>

According to the present embodiment, the imprint mold 1 described above can be manufactured by applying the following method. Note that the contents not described below are as described in <Imprint mold 1>.

A method for manufacturing the imprint mold 1 according to the present embodiment is as follows.

(Mold Blank 10)

The mold 1 manufactured in the present embodiment is the imprint mold 1 having a mold pattern having the plurality of recesses 1c having different depths, and as illustrated in FIG. 1, is the mold 1 having at least the recess 1c having depth D1 and the recess 1c having depth D2 (D1≠D2) from the mold surface 1s.

The mold is manufactured using the mold blank 10 prepared in advance based on the design of the mold 1 to be obtained.

In the mold blank 10, based on a desired digging depth of the mold 1, the number of the mold base material layers 4 to be built up, the number of the etching stopper layers 3 to be built up, building-up order, the thickness of each of the mold base material layers 4, and the thickness of each of the etching stopper layers 3 are adjusted in advance. Using this, the recesses 1c are formed at different positions and with N different depths (recess forming step). In other words, the recesses 1c are formed by performing mold digging etchings of individually different desired depths at least N times (that is, at N locations). Of course, additionally, the recesses 1c having the same depth or different depths may be further formed.

Note that the mold base material layer 4 and the etching stopper layer 3 can be formed by applying a known film forming method such as a sputtering method.

An outline of a cross section of the mold blank 10 used in the present embodiment is illustrated in FIG. 2A.

In the mold blank 10 of the present embodiment, the plurality of mold base material layers 4 is layered on a surface of the substrate 2, the hard mask layer 5 is formed on a surface side of the mold base material layers 4, and a resist layer is further formed on the hard mask layer 5.

The etching stopper layer 3 having a thickness W is interposed between each mold base material layers 4. Here, all the etching stopper layers 3 have the same thickness.

When the thickness of the uppermost mold base material layer 4 is represented by K1, and the thickness of the second highest mold base material layer 4 is represented by K2, $K1=D1$, and $K2=D2-(D1+W)$ are satisfied.

The mold base material layer 4 and the etching stopper layer 3 are made of materials having etching selectivity for each other.

The expressions K1 and K2 are defined for the two recesses 1c having the first and second smallest depths out of the recesses 1c to be formed for the mold blank 10.

In a case where the recess 1c having a depth D3, which is different from both D1 and D2, is further formed, the mold blank 10 further has a stack of the mold base material layer 4 having a thickness K3 (see FIG. 2A), and $K3=D3-(D1+D2+2W)$ is satisfied. That is, in a case where the mold blank 10 has the recesses 1c having n types of depths, the stack including K1, K2, K3, . . . Kn (the etching stopper layer 3 is interposed between each of these) to be included in the mold blank 10 has the following relationship.

$Kn=Dn-(D1+D2+ \ldots (n-1)W)$

That is, considering the mold 1 having the deeper recess 1c in addition to the above two recesses 1c, in the mold blank 10 for obtaining the imprint mold 1 having the recesses 1c having depths D1, D2, . . . Dn (n is an integer of 3 or more, D1, D2 . . . Dn are different from each other) from the mold surface 1s, the plurality of mold base material layers 4 is layered on a surface of the substrate 2, and the hard mask layer 5 is further formed on a surface side of the mold base material layers 4, the etching stopper layer 3 having a thickness W is interposed between each of the mold base material layers 4, and when the thickness of the uppermost mold base material layer 4 is represented by K1, the thickness of the second highest mold base material layer 4 is represented by K2, and the thickness of the n-th highest mold base material layer 4 is represented by Kn in the stack, $K1=D1$ and $K2=D2-(D1+W)$ $Kn=Dn-(D1+D2+ \ldots (n-1)W)$ are satisfied.

Note that in the present embodiment, at least one of K1, K2, . . . Kn can have a value different from those of the other K, and all the K may have different values from each other.

(Hard Mask Layer 5)

The hard mask layer 5 has a function of predefining a digging position, that is, the position of the recess 1c to be formed, prior to etching the plurality of mold base material layers 4. All the digging positions to be formed and the plan-view shape of a pattern thereof are determined by a hard mask pattern 5p.

A material of the hard mask layer 5 has etching resistance to both of the etchants of the mold base material layer 4 and the etching stopper layer 3.

That is, preferably, the hard mask layer 5 has etching selectivity for the mold base material layer 4 and also has etching selectivity for the etching stopper layer 3.

Note that the hard mask layer 5 can be removed after all the desired dug portions are formed.

Examples of the material of the hard mask layer 5 include a material containing chromium (Cr) (for example, at least one of chromium oxide (CrO), chromium nitride (CrN), chromium oxynitride (CrON), and a material containing carbon in each of these compounds).

The hard mask layer 5 ensures patterning accuracy by exhibiting a mask function, with a small film thickness, at the time of etching the mold base material layer 4 and the etching stopper layer 3. This effect is remarkable when dry etching is applied. Therefore, the layer thickness of the hard mask layer 5 is preferably, for example, 3 to 30 nm.

(Resist Film)

As the resist film, a known photoresist can be used. As the resist, a positive type photoresist or a negative type photoresist can be used. Note that in a case where exposure for forming a resist pattern is performed by electron beam drawing, a chemically amplified resist for electron beam may be used. A resist can be applied onto the hard mask layer 5 with a known coating device such as a slit coater or a spin coater.

The film thickness of the resist film is not particularly limited, but is preferably, for example, 50 to 300 nm considering the durability of the resist film during etching time for the hard mask layer 5 for forming the hard mask pattern 5p, and the lower accuracy of a formed pattern which can be caused if the film thickness of the resist film is too large.

FIGS. 2A to 2P are schematic cross-sectional views illustrating an example of the method for manufacturing the mold 1 according to the present embodiment of the present disclosure.

First, the mold blank 10 as illustrated in FIG. 2A is prepared. Here, in the mold blank 10, the three mold base material layers 4 are layered, and the etching stopper layer 3 is interposed between each mold base material layers 4. In FIG. 2A, the etching stopper layer 3 is also disposed between the substrate 2 and the lowermost mold base material layer 4. In addition, the three etching stopper layers 3 in total are disposed, and all the etching stopper layers 3 have the same thickness W (nm). Although all the mold base material layers 4 are illustrated with the same thickness in FIGS. 2A-2P, as described in <Imprint mold 1>, the mold base material layers 4 having different thicknesses are preferably included.

The mold blank 10 according to the present embodiment further includes the hard mask layer 5, formed on the layered mold base material layers 4, and a first resist film 61. Note that the mold blank 10 here may be a mold intermediate in which a part of the mold base material layer 4 is already patterned.

As illustrated in FIG. 2B, drawing (first drawing) and development are performed on the first resist film 61 on the prepared mold blank 10 to form a first resist pattern 61p. The first resist pattern 61p has an opening corresponding to a dug portion to be formed.

Even if drawing is performed with an electron beam, in a case where the hard mask layer 5 has conductivity, occurrence of charge-up can be suppressed, which is preferable.

As illustrated in FIG. 2C, the hard mask layer 5 is etched using the first resist pattern 61p as a mask to form the hard mask pattern 5p (hard mask patterning step). This makes it possible to determine the width and position of the dug portion.

Dry etching or wet etching can be applied to etching of the hard mask layer 5, and in the present embodiment, dry etching is used. When a material of the hard mask layer 5 is CrO, a known gas such as a gas containing chlorine ($Cl_2$) can be used as an etching gas as an etchant.

As illustrated in FIG. 2D, the first resist pattern 61p is peeled off. A known method can be adopted for peeling, and for example, a resist peeling agent formed of a mixed solution of sulfuric acid and hydrogen peroxide solution may be used. Hereinafter, the same applies to peeling of a resist pattern.

As illustrated in FIG. 2E, the uppermost mold base material layer 4 is etched using the hard mask pattern 5p as a mask to form a first digging pattern. The digging depth of the recess 1c in the first digging pattern is D1 (=K1).

Dry etching or wet etching can be applied to etching of the uppermost mold base material layer 4, and in the present embodiment, dry etching is used. As an etching gas, a known gas (for example, a gas containing fluorine, preferably $CF_4$ in a case where $SiO_2$ is used as a material of the mold base material layer 4) can be used. The same applies to etching of the mold base material layer 4 described later.

As illustrated in FIG. 2F, a resist is applied to a surface of the mold blank 10 including the hard mask pattern 5p to form a new second resist film 62. As a raw material of the second resist film 62, a material similar to that of the above resist can be used.

As illustrated in FIG. 2G, drawing (second drawing) and development are performed on the second resist film 62 to form a second resist pattern 62p. The second resist pattern 62p covers a part of the formed first digging pattern and exposes the other part. This is intended to protect an area, where the final digging depth to be obtained is D1, from etching. As a drawing apparatus, a similar apparatus to that used for forming the first resist pattern 61p can be used.

Note that misalignment may occur between the first drawing and the second drawing, and therefore drawing dimensions may be added (sizing may be performed) to drawing data of the second drawing by an alignment margin determined based on a predicted amount of misalignment. That is, as illustrated, a part of the hard mask pattern 5p can be exposed in an opening of the second resist pattern 62p. This exposure width (sizing width) can be 5 to 200 nm.

As illustrated in FIG. 2H, the uppermost etching stopper layer 3 is etched using the second resist pattern 62p and the hard mask pattern 5p as a mask.

Dry etching or wet etching can be applied to etching of the uppermost etching stopper layer 3, and in the present embodiment, dry etching is used. As an etching gas, a known gas (for example, $CCl_4$ in a case where $Al_2O_3$ is used as a material of the etching stopper layer 3) can be used. The same applies to etching of the intermediate etching stopper layer 3 described later.

As illustrated in FIG. 2I, the second highest mold base material layer 4 is etched using the second resist pattern 62p and the hard mask pattern 5p as a mask to form a second digging pattern. The digging depth of the recess 1c in the second digging pattern is D2 (=K1+K2+W) from the mold surface 1s.

As illustrated in FIG. 2J, the second resist pattern 62p is peeled off.

As illustrated in FIG. 2K, a resist is applied to a surface of the mold blank 10 including the hard mask pattern 5p. As a raw material of the third resist film 63, a material similar to that of the above resist can be used.

As illustrated in FIG. 2L, drawing (third drawing) and development are performed on the third resist film 63 to form a third resist pattern 63p. The third resist pattern 63p covers a part of the second digging pattern in addition to the formed first digging pattern and exposes the other part. As a drawing apparatus, a similar apparatus to that used for forming the first resist pattern 61p can be used.

Note that misalignment may occur among the first drawing, the second drawing, and the third drawing, and therefore, sizing may be performed on drawing data of the third drawing in a similar manner to that of the second drawing.

As illustrated in FIG. 2M, the second highest etching stopper layer 3 is etched using the third resist pattern 63p and the hard mask pattern 5p exposed in an opening of the third resist pattern 63p as a mask.

As illustrated in FIG. 2N, the third highest mold base material layer 4 is etched. With this, a third digging pattern can be formed. The digging depth of the recess 1c of the third digging pattern is D3 (=K1+K2+K3+2W) from the mold surface 1s.

As illustrated in FIG. 2O, the third resist pattern 63p is peeled off.

Note that in a case where the number of the mold base material layers 4 to be built up is larger than three, the N-th digging pattern can be formed by repeating similar steps to the above. The digging depth of the recess 1c of this N-th digging pattern is Dn (=K1+K2+ . . . +Kn+(n−1)W) from the mold surface 1s.

In formation of each recess 1c, etching is completed when the etching stopper layer 3 is exposed and a bottom surface is formed. The depth of each of the plurality of recesses 1c is the sum of the thicknesses of the number, which varies depending on recess 1c, of the mold base material layers 4 removed by digging and the etching stopper layer 3 interposed between the removed mold base material layers 4. In other words, at a design stage of the mold blank 10, a desired depth of the recess 1c is determined in advance, and arrangements of the mold base material layers 4 and the etching stopper layers 3 are determined such that the etching stopper layer 3 is located at a bottom of the recess 1c.

After required etching of the mold base material layers 4 is completed, as illustrated in FIG. 2P, the hard mask pattern 5p is peeled off.

As described above, the mold 1 according to the present embodiment is completed. The present embodiment can exhibit the following effects.

The mold 1 of the present embodiment has a plurality of dug portions, and the etching stopper layer 3 is exposed on a bottom surface of each of the dug portions. That is, an end point of the digging etching is a time point when the etching stopper layer 3 is exposed, and the etching stopper layer 3 is left. As a result, the etching end point can be easily determined, the shape of the bottom of the dug portion to be formed is as designed, and the depth of the recess 1c can be controlled more precisely.

That is, it is of great significance to control the accuracy of the depth of the recess 1c in a range of ±5 nm or ±2 nm with respect to a target depth.

Furthermore, it goes without saying that there is a cost advantage that a step of etching the etching stopper layer 3 can be reduced.

Furthermore, in the method for manufacturing the mold 1 of the present embodiment, when the hard mask pattern 5*p* is formed, the positions and dimensions of the dug portions are determined, and even if drawing is repeated in the subsequent steps, the location of each recess 1*c* is not deviated from the design value. From this, in the mold 1 of the present embodiment, the pattern forming position thereof and the dimensions thereof coincide with target values with high accuracy.

That is, the manufacturing method of the present disclosure can obtain patterning accuracy by applying an optimum layered structure and a manufacturing process to each of the materials of the mold base material layer 4 and the etching stopper layer 3, and is particularly excellent in digging depth control.

Furthermore, the digging depths of the plurality of dug portions can be determined by the thicknesses of the mold base material layer 4 and the etching stopper layer 3. Therefore, at the stage of designing the mold blank 10, it is only required to determine film forming conditions according to a digging depth to be obtained.

Note that although not illustrated in the manufacturing method of FIGS. 2A-2P, it is also possible to simultaneously etch the mold base material layers 4 having different thicknesses depending on a manufacturing method. In this case, when etching of the mold base material layer 4 having a relatively small thickness is completed, etching of the mold base material layer 4 having a larger thickness is not completed. Therefore, if etching of the mold base material layer 4 having a larger thickness is continued, an edge portion exposed by etching may be damaged in the mold base material layer 4 having a relatively small thickness, and the pattern width may be changed. On the other hand, according to the method for manufacturing the mold 1 according to the present embodiment, the steps of etching the mold base material layers 4 having different thicknesses are independently controlled for each of the mold base material layers 4, and such a change can be reduced.

In addition, according to the present embodiment, the substrate 2, the etching stopper layer 3, and the mold base material layer 4 can be set to be transparent. As a result, in a case where an optical element or the like is manufactured by imprint using the mold 1 according to the present embodiment, in a state where a pattern surface of the mold 1 is pressed against an object to which transferring is applied (a photocurable resin or the like), the resin can be irradiated with light via the mold 1. This makes it possible to manufacture a product such as an optical element, a replica for further performing transfer, and the like.

As a result of the above, the present embodiment can provide the imprint mold 1 for an optical element having extremely high accuracy in the shape and depth of the recess 1*c* of the mold pattern and a method for manufacturing the imprint mold 1.

<Method for Manufacturing Working Replica and/or Optical Element>

A method for manufacturing an optical element with the mold 1 according to the present embodiment is as follows.

That is, the manufacturing method includes:

preparing the imprint mold 1 according to the present embodiment; and directly or indirectly pressing the mold surface 1*s* of the imprint mold 1 against an object containing a resin material and transferring the mold pattern to the object.

Here, a procedure for performing pattern transfer to an object by optical imprint will be described. In a case of optical imprint using an ultraviolet ray, an imprint process at room temperature (for example, 10 to 30° C.) is possible. A preferable wavelength or the like of the ultraviolet ray at this time is similar to that described in <Imprint mold 1>. However, the mold 1 of the present embodiment may be applied to thermal imprint.

Figure 3A:
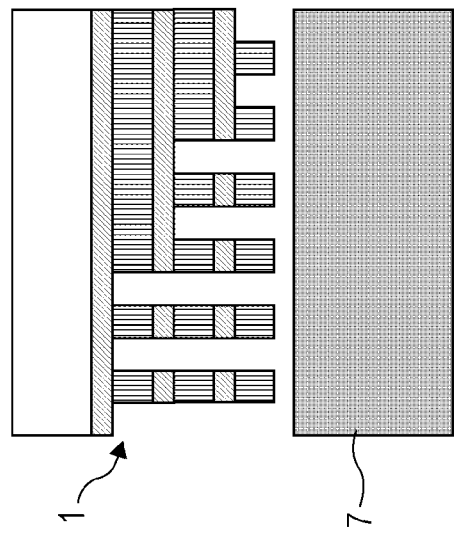
Figure 3B:
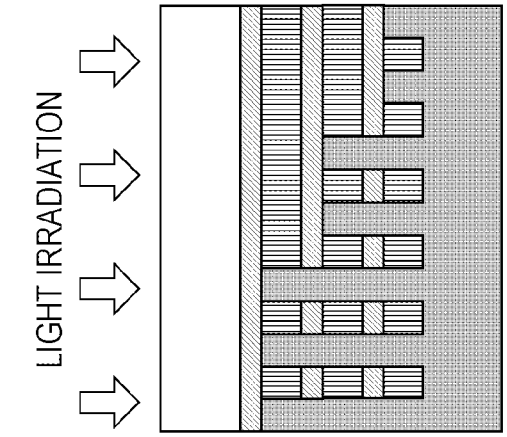

FIGS. 3A-3C are schematic cross-sectional views illustrating an outline of pattern transfer by optical imprint using the imprint mold 1 of the present embodiment.

In a case where pattern transfer is performed by optical imprint, first, an object to which a pattern is transferred is prepared. The object can be a photocurable resin applied onto a main surface of the substrate 2 (not illustrated).

This photocurable resin may be liquid before being cured. In the case of liquid, the photocurable resin quickly enters the recess 1*c* of the mold 1 that has been turned upside down, and it is easy to accurately transfer the shape of the recess 1*c*. Therefore, the viscosity of the photocurable resin before being cured is preferably low, and preferably about 10 to 1000 mPa·s (25° C.)

Note that examples of the photocurable resin include a resin solution obtained by mixing, for example, an epoxy-based or urethane-based base resin with a photopolymerization initiator, a radical generator, or the like. In addition, a resin material that is cured by light other than an ultraviolet ray may be adopted.

Then, the mold 1 according to the present embodiment illustrated in FIG. 1 is turned upside down, and the mold 1 is disposed such that a photocurable resin 7 and the mold surface is face each other (FIG. 3A).

Then, the mold 1 is directly pressed against the photocurable resin 7 to be brought into contact with the photocurable resin 7. Thereafter, the photocurable resin 7 is cured by exposure to an ultraviolet ray to form a resin pattern (FIG. 3B). For example, the ultraviolet ray can be emitted to the photocurable resin 7 through the mold 1 from a back surface side of the mold surface is.

An exposure type is not particularly limited.

Then, by releasing the mold 1, a mold pattern is transferred to the photocurable resin 7 (FIG. 3C). Based on this transferred pattern, the cured resin may be further subjected to processing such as etching to manufacture an optical element. In addition, the cured resin to which the pattern is transferred may be used as a working replica 8, that is, a copy of the imprint mold 1, instead of being used as the optical element, and the optical element may be manufactured using this copy. Note that the working replica 8 is used for manufacturing the optical element, and in a broad sense, the working replica 8 can also be interpreted as the optical element.

Summarizing the above, according to the mold 1 of the present embodiment, the substrate 2, the etching stopper layer 3, and the mold base material layer 4 are each transparent as described above. In a case where an optical element or the like is manufactured by imprint using the mold 1 according to the present embodiment, by irradiating a photocurable resin as a resin material with light via the mold 1 in a state where a pattern surface of the mold 1 is pressed against the resin from above, a product such as the optical element, a replica, or the like can be manufactured.

Note that in order to make it easy to release the mold 1, a mold release layer may be formed on an outermost surface of the mold 1 (that is, a surface in contact with the atmosphere and including not only the mold surface is but also a bottom and sides of the recess 1*c*). In this case, the mold surface 1s of the mold 1 is indirectly pressed against an object containing a resin material.

As a mold release agent, known ones can be used. Examples of the mold release agent include a surface modifier made of an organic silicone compound having a linear perfluoropolyether structure, an unmodified or modified silicone oil, a polysiloxane containing trimethylsiloxy-silicic acid, a silicone-based acrylic resin, and the like. In addition, as described in JP 2012-048772 A, as the mold release agent, a compound may be used in which a main chain in a molecular chain contains one or more types of $(C_mF_{2m}O)_n$ [m is an integer satisfying $1 \leq m \leq 7$, and n is an integer with which the molecular weight of $(C_mF_{2m}O)_n$ is 500 or more and 6000 or less], and at least two hydroxyl groups are included as adsorption functional groups that can be adsorbed on the mold 1, and the hydroxyl groups are located at both ends of the molecular chain.

REFERENCE SIGNS LIST 1 (Imprint) mold
1c Recess
1s Mold surface
2 Substrate
3 Etching stopper layer
4 Mold base material layer
5 Hard mask layer
5p Hard mask pattern
61 First resist film
61p First resist pattern
62 Second resist film
62p Second resist pattern
63 Third resist film
63p Third resist pattern
7 Photocurable resin
8 Working replica
10 Mold blank

The invention claimed is:

1. An imprint mold having a plurality of recesses constituting a predetermined mold pattern, the predetermined mold pattern being to be transferred to an object by an imprint method, wherein
the imprint mold comprises a stack, comprising a plurality of mold base material layers, an etching stopper layer interposed between each of the mold base material layers in the plurality of mold base material layers, on a substrate, and another etching stopper layer disposed between the mold base layer closest to the substrate and the substrate,
the stack has the plurality of recesses having different depths,
all of the mold base material layers are made of a first material having etching selectivity with respect to a second material of the etching stopper layer and the another etching stopper layer, and
each of the plurality of recesses has a bottom surface on which the etching stopper layer or the another etching stopper layer is exposed.

2. The imprint mold according to claim 1, wherein each of the plurality of recesses having respectively different depths is formed by vertically digging a mold surface individually and independently.

3. The imprint mold according to claim 1, wherein the stack comprises the plurality of mold base material layers having different thicknesses.

4. The imprint mold according to claim 1, wherein a relative ratio of ultraviolet ray transmittances of the first material and the second material is 1:0.8 to 1:0.95 when the each of the plurality of mold base material layers and the etching stopper layer or the another etching stopper layer have the same thickness.

5. The imprint mold according to claim 1, wherein a thickness of each of the plurality of mold base material layers is 3 to 25 times a thickness of the etching stopper layer or the another etching stopper layer.

6. The imprint mold according to claim 1, wherein the plurality of recesses is formed by etching and removing different numbers of the mold base material layers, the numbers being two or more and five or less.

7. The imprint mold according to claim 1, which is to be applied to optical imprint using an ultraviolet ray.

8. A method for manufacturing an optical element, the method comprising:
preparing the imprint mold according to claim 1; and
directly or indirectly pressing a mold surface of the imprint mold against an object comprising a resin material, and transferring the mold pattern to the object.

* * * * *